US008332718B2

(12) United States Patent
Scarpa et al.

(10) Patent No.: US 8,332,718 B2
(45) Date of Patent: Dec. 11, 2012

(54) EFFICIENT IMPLEMENTATION TO PERFORM ITERATIVE DECODING WITH LARGE ITERATION COUNTS

(75) Inventors: Carl Scarpa, Plainsboro, NJ (US); Edward Schell, Jackson, NJ (US)

(73) Assignee: Sirius XM Radio Inc., New York, NY (US)

( * ) Notice: Subject to any disclaimer, the term of this patent is extended or adjusted under 35 U.S.C. 154(b) by 1108 days.

(21) Appl. No.: 12/079,467

(22) Filed: Mar. 26, 2008

(65) Prior Publication Data

US 2008/0307294 A1  Dec. 11, 2008

Related U.S. Application Data

(60) Provisional application No. 60/920,919, filed on Mar. 29, 2007.

(51) Int. Cl.
*G06F 11/00* (2006.01)
(52) U.S. Cl. .......................... 714/758; 714/800
(58) Field of Classification Search .................. None
See application file for complete search history.

(56) References Cited

U.S. PATENT DOCUMENTS

| | | | | |
|---|---|---|---|---|
| 6,678,857 | B2 * | 1/2004 | Sindhushayana et al. | 714/755 |
| 6,988,233 | B2 * | 1/2006 | Kanai et al. | 714/755 |
| 7,222,286 | B2 * | 5/2007 | Kim | 714/784 |
| 7,577,891 | B2 * | 8/2009 | Farjadrad et al. | 714/752 |
| 7,584,389 | B2 * | 9/2009 | Park et al. | 714/704 |
| 7,765,453 | B2 * | 7/2010 | Duggan | 714/755 |
| 7,770,087 | B2 * | 8/2010 | Laprade et al. | 714/755 |
| 7,966,505 | B2 * | 6/2011 | Gao et al. | 713/320 |
| 2005/0193308 | A1 | 9/2005 | Shin | |
| 2005/0268206 | A1 | 12/2005 | Tran et al. | |
| 2006/0156163 | A1 | 7/2006 | Berens et al. | |

OTHER PUBLICATIONS

International Search Report and Written Opinion of the International Searching Authority, issued for corresponding PCT Application PCT/US2008/04143, Jul. 8, 2008.

* cited by examiner

*Primary Examiner* — Christopher McCarthy
(74) *Attorney, Agent, or Firm* — Kramer Levin Naftalis & Frankel LLP

(57) ABSTRACT

Systems and methods are presented to improve the performance of a constant bit rate iterative decoder by providing elastic buffering, while utilizing a relatively simple decoder architecture capable of maintaining a fixed number of iterations of a lower value. An LDPC decoder can be designed, for example, to support less than the maximum possible number of iterations, and can, for example, be mated to elastic input and output buffers. If a given code block, or succession of code blocks, requires the maximum number of iterations for decoding, the decoder can, for example, run at such maximum number of iterations and the elastic input buffer can, for example, hold code blocks waiting to be processed so as to maintain a constant input rate. Alternatively, if one or more code blocks requires less than the nominal number of iterations, the output buffer can store those code blocks so as to preserve a constant output rate. It is emphasized that this abstract is provided to comply with the rules requiring an abstract, and is submitted with the understanding that it will not be used to interpret or limit the scope or the meaning of the claims.

24 Claims, 1 Drawing Sheet

EFFICIENT IMPLEMENTATION TO PERFORM ITERATIVE DECODING WITH LARGE ITERATION COUNTS

CROSS-REFERENCE TO OTHER APPLICATIONS

This application claims the benefit of and incorporates by reference U.S. Provisional Patent Application No. 60/920,919, entitled "EFFICIENT IMPLEMENTATION TO PERFORM ITERATIVE DECODING WITH LARGE ITERATION COUNTS," filed on Mar. 29, 2007.

TECHNICAL FIELD

The present invention relates to systems and methods for implementing iterative error-correcting codes, and more particularly to systems and methods to improve the performance of a constant bit rate iterative decoder.

BACKGROUND INFORMATION

Low Density Parity Check ("LDPC") codes, originally invented in 1962 by Gallagher, have recently been utilized in various communications applications. Because LDPC codes are based on an iterative decoding scheme, the performance of an LPDC decoder is highly dependent upon the number of iterations available to properly decode the information. Under poor signal conditions, a decode instance can consume hundreds of iterations and still be on the road to convergence. As a matter of implementation, designing decoder architectures capable of achieving large iteration counts can be quite difficult. Systems with large block sizes and/or high data rates can further exacerbate the problem, placing a physical limit on the number of iterations that can be performed between code blocks. However, some systems may not require that a consistently large number of iterations be available for each code block. Nominally, these systems could be expected to converge in a much shorter number of cycles, and may only require additional iterations at sporadic instances. Decoder design could be made simpler for such systems provided that such design could also adequately support sporadic demands (which at some times are sustained over multiple code blocks) for high iteration counts.

What is thus needed in the art are systems and methods that can support a large number of iterations for decoding when necessary, but that also avoid a complex decoder design.

SUMMARY

Systems and methods are presented to improve the performance of a constant bit rate iterative decoder by supporting a large number of decoding iterations at needed instances through elastic buffering, while utilizing a relatively simple decoder architecture capable of maintaining a fixed number of iterations of a lower value. In exemplary embodiments of the present invention, an LDPC decoder can be designed, for example, to support less than the maximum possible number of iterations, and can be, for example, mated to elastic input and output buffers. If a given code block, or succession of code blocks, requires, for example, a maximum number of iterations for decoding, the decoder can, for example, run at such maximum number of iterations and the elastic input buffer can, for example, hold code blocks waiting to be processed so as to maintain a constant input rate. Alternatively, for example, if one or more code blocks requires less than the nominal number of iterations, the output buffer can store those code blocks once they have been processed so as to preserve a constant output rate.

Figures 1, 2, 3, 4:
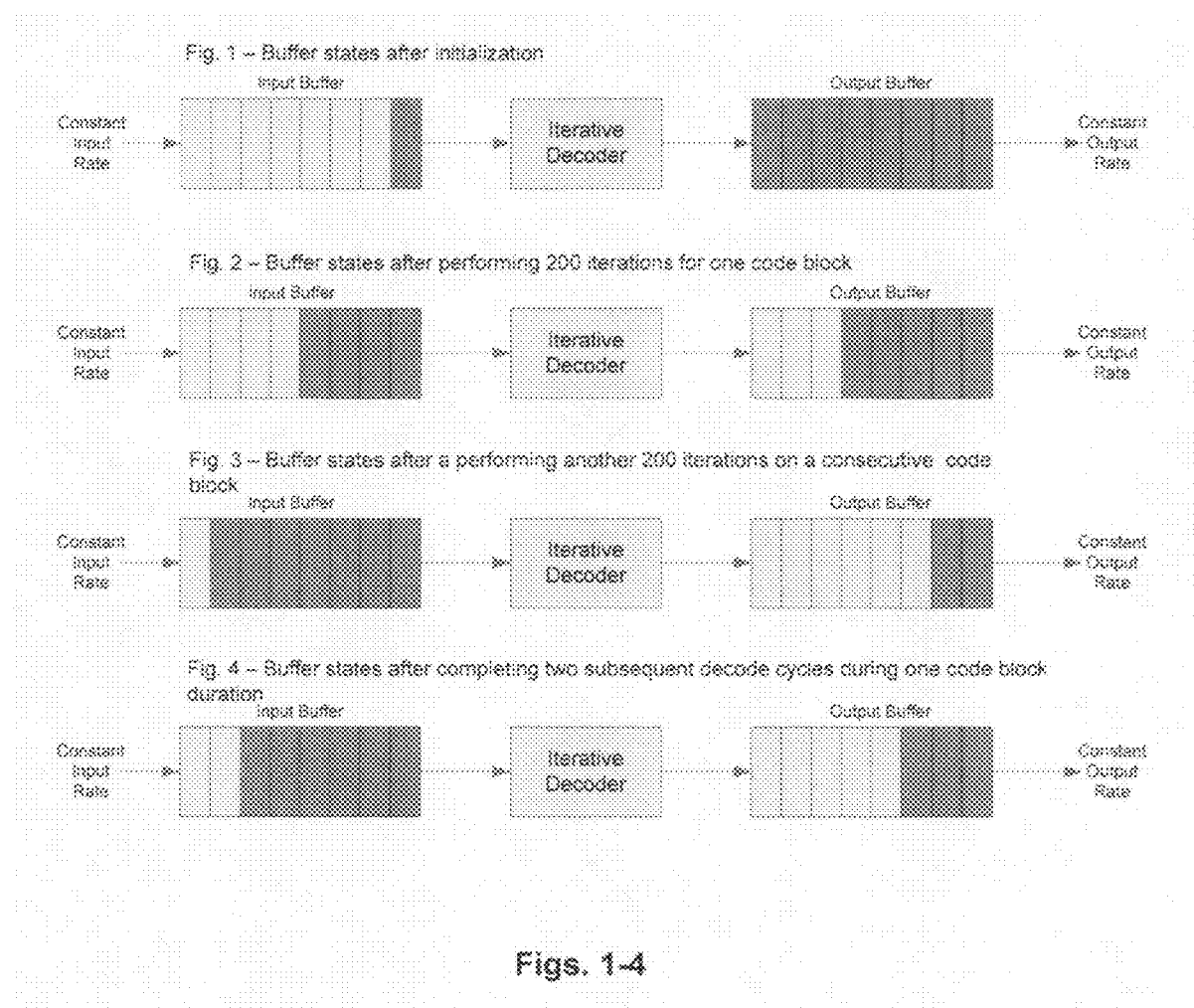
FIG. 1 depicts an exemplary iterative decoder and exemplary input and output buffers after initialization according to an exemplary embodiment of the present invention.
FIG. 2 depicts the exemplary iterative decoder and the exemplary input and output buffers of FIG. 1 after using two hundred iterations for one code block according to an exemplary embodiment of the present invention.
FIG. 3 depicts the exemplary iterative decoder and the exemplary input and output buffers of FIG. 2 after an additional 200 iterations on one code block have been performed according to an exemplary embodiment of the present invention.
FIG. 4 depicts the exemplary iterative decoder and the exemplary input and output buffers of FIG. 3 after two decode cycles have been completed according to an exemplary embodiment of the present invention.

It is further noted that the patent or application file contains at least one drawing executed in color. Copies of this patent or patent application publication with color drawings will be provided by the U.S. Patent Office upon request and payment of the necessary fees.

DETAILED DESCRIPTION

For ease of illustration, the following description will assume a Low Density Parity Code ("LDPC") code is utilized in an exemplary decoder, it being understood that the systems and methods of the present invention can be applied to any iterative code, utilitzed in any iterative decoder. Iterative codes, include, amongst other examples, LDPC codes, turbo codes, and variantions of those. Iterative algorithms are understood to be decoding algorithms that utilize a variable number of recursive steps, have some measure of convergence, and operate on blocks of data.

Simulations of certain LDPC codes, for example, have shown that an average of forty (40) iterations are required for decoding near the waterfall region, but as many as several hundreds are occasionally required to successfully converge. Because a decoder utilizing such an LDPC code seldom needs the full maximum number of iterations to converge properly, designing a decoder capable of supporting the maximum iterations on each code block can be highly inefficient, and in some cases may not even be possible. In exemplary embodiments of the present invention a more practical solution can be implemented. For example, a decoder can be designed with less than the maximum number of iterations, treating code blocks that need more iterations as special conditions. In so doing, the complexity of the decoder can be greatly reduced. Since such an exemplary decoder nominally uses less iterations than it is capable of, there is a potential for the wasted iterations to be saved for use on more difficult code blocks.

In order to handle code blocks that require more iterations, in exemplary embodiments of the present invention, a decoder can, for example, be mated to elastic buffers at its input and output. After initialization, for example, the output buffer can be assumed to be running near capacity, and the input buffer can be assumed to be running near empty.

In exemplary embodiments of the present invention, each code block handed to the decoder can, for example, be processed using a maximum number of iterations, M, spanning multiple code blocks, where M can be, for example, a number far greater than the number of iterations the decoder is capable of processing during the duration of one code block in time, which is the nominal iteration count, N, of the decoder. In general, M can be, for example, an integer multiple of N. If the decoder utilizes more than such N nominal iterations, an elastic input buffer can, for example, begin to fill up, while an elastic output buffer can begin to drain. Further code blocks may also be processed at more than the nominal number of iterations, as long as there is enough room left in the input buffer to queue subsequent code blocks. Similarly, code blocks requiring less than the nominal number of iterations of the decoder can be processed using such a lesser number of iterations, provided that there is enough storage at the output buffer. This allows the datastream to propogate at a constant input and output rate through the decoder while the decoder processes individual code blocks at variable iteration counts, and thus at variable rates. Eventually, the buffers will reach their limit and the decoder will be limited to processing each code block at the nominal iteration count. However, as code blocks are subsequently processed that require less than the nominal number of iterations, the buffers can begin to settle back towards their initial state. Thus, in order to drain the input buffer it is necessary to process data faster than the fill rate of the buffer. If, as the result of such processing the input buffer becomes empty, the decoder can then, for example, simply hold off processing any data until the next code block arrives.

In exemplary embodiments of the present invention, the sizes of the elastic buffers can, for example, be chosen based upon the generally expected number of consecutive code blocks that would need more than a nominal number of iterations. For each such consecutive code block, the memory size can, for example, increase by a fixed number of code blocks, based on the ratio of maximum iterations to nominal iterations, which can be, for example, be kept to an integer relationship. In exemplary embodiments of the present invention, control of the elastic buffering can be greatly simplified to a decision as to whether the decoder may or may not use the maximum iterations. If there is not enough buffer space to use the full maximum iterations, then the decoder can, for example, resort to the nominal number of iterations. Or, for example, in a slightly more advanced approach, the precision can be limited to a code block boundary, choosing the buffer size as a multiple of a single code block. Decoding can then be permitted, for example, to use a multiple of the nominal iteration count, depending on how many code blocks can fit into the remaining input buffer space. This latter option, can, for example, allow for greater granularity in the allowed iterations.

To prevent wasted iterations on code blocks that would never converge, or may not need to, in exemplary embodiments of the present invention multiple techniques can be implemented to allow the decoder to exit early (i.e., stop decoding the code block currently being processed). If, for example, a parity check indicates that a large portion of the bits of the currently processed code block are still in error after a pre-defined number of iterations, it can be assumed, for example, that the code block will most likely fail. Thus, additional time need not be wasted on any additional iterations for that code block.

Another indicator of non-convergence that can be used, for example, is a static parity error count. Sometimes a decoder can reach a certain parity error count and will not be able to get past it. On successive iterations, the parity error count will either remain the same or hover within a small delta in a varying, but non-converging cycle. In exemplary embodiments of the present invention, if this condition persists for a pre-defined number of iterations, the decoder can, for example, be assumed to be not likely to converge for that code block, and can, for example, exit early, which may not necessarily produce bit errors. In fact, this condition usually occurs as a result of weakly protected parity bits, after the information bits have already converged. Using a weak outer code, such as, for example, BCH, residual errors in the data can be corrected. In exemplary embodiments of the present invention, depending on the correction ability of the outer code, an exemplary LDPC decoder can also exit early when the parity count is below some minimum threshold. This can be done in realization of the fact that an LDPC decoder can take several iterations trying to completely overcome the last few parity errors, sometimes unsuccessfully. If the parity sum gets below some minimum threshold, it is possible to exit early, relying on the outer code to correct any errors in the data. In general, the choice of such a threshold should be done with care, since it is unknown how many actual bits are in error relative to an individual parity error. In each case, for example, the unused iterations can be saved and be applied to a more worthy code block, thus allowing the input buffer to drain and thus prevent it from backing up unnecessarily.

FIGS. 1-4 illustrate the growth and reduction of exemplary elastic buffers according to an exemplary embodiment of the present invention as additional iterations are performed or as iterations less than the nominal number are deemed sufficient. Each slot in the buffers of FIGS. 1-4 represents the size of a code block, where the lighter shading (light blue or white) represents an empty slot, and the darker shading (grey) represents an occupied slot. In the example depicted in FIGS. 1-4 the nominal iteration count N is fifty; the buffer is thus designed so that fifty iterations can be completed in the temporal duration of one code block.

FIG. 1 depicts the buffer states after initialization, where the input buffer has one code block and the output buffer is full. FIG. 2 depicts the buffer state if, for example, the next code block were to require two hundred iterations, a factor of four times the nominal count. With reference to FIG. 2, at the input one code block has been removed for decoding, while four more have arrived, creating an increase of three code blocks in the buffer relative to the input buffer's state as depicted in FIG. 1. At the output, four code blocks leave the buffer to maintain the constant output rate, while only one decoded block enters the output buffer.

FIG. 3 illustrates the consequence of, for example, a second code block also requiring two hundred iterations. The input buffer is now near capacity and the output buffer is nearly depleted, thus limiting the allowable iterations for the next code block.

FIG. 4 illustrates the reduction in buffer size if, for example, the next two code blocks only require half the nominal iteration count. The input buffer received only one additional code block, while the decoder consumed two during a single code block duration, reducing the level by one block. Thus, only one code block left the output buffer, while two code blocks have entered, leaving a surplus of one code block.

Thus, in exemplary embodiments of the present invention, a novel way to approach ideal decoding performance, with the advantage of using a much simpler decoder architecture, can be implemented. Since input and output buffers are a natural part of any communications system, the additional control logic and memory requirements associated with the disclosed methods do not add any significant expense. In fact, in exemplary embodiments of the present invention, the benefits of allowing an iterative decoder to run at a much slower rate can far outweigh the cost of providing elastic buffers.

As noted above, the methods of the present invention can be applied to any type of iterative decoding architecture, where the data rates are constant and the maximum possible iterations are not easily met.

While the present invention has been described with reference to certain exemplary embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed:

1. A method of efficiently performing iterative decoding, comprising:
    setting a decoder to operate at a nominal iteration rate N;
    allowing the decoder to increase or decrease the number of iterations when needed or feasible; and
    storing a queue of code blocks in each of an elastic input buffer and an elastic output buffer,
    wherein the input rate of code blocks to the input buffer and the out put rate of code blocks from the output buffer is constant,
    wherein the size of the elastic input buffer is a function of the expected number, Nseq, of sequential code blocks that would require M iterations, and
    wherein the size of the elastic input buffer is Nseq multiplied by the size of a code block multiplied by M/N, or Nseq*M/N*Block_size.

2. The method of claim 1, wherein the decoder can increase to a maximum number of iterations M.

3. The method of claim 2, wherein M is an integer multiple of N.

4. The method of claim 1, wherein the decoder implements one of a Low Density Parity Code, a Turbo code and a modification of either of them.

5. The method of claim 1, wherein the size of the elastic output buffer is a function of the expected number of sequential code blocks that can be processed with less than N iterations.

6. The method of claim 1, wherein if the elastic input buffer is filled, the decoder operates at no more than N iterations per code block.

7. The method of claim 1, wherein the decoder can exit processing of a code block upon the detection of one of a defined set of termination indicators.

8. The method of claim 7, wherein the defined set of termination indicators include large portion of bits still in error after a defined number of iterations, static parity error count, and parity sum below a defined minimum threshold.

9. A system for efficient iterative decoding, comprising:
    a decoder set to operate at a nominal iteration rate N; and
    an elastic input buffer and an elastic output buffer each coupled to the decoder,
    wherein the input rate of code blocks to the input buffer and the out put rate of code blocks from the output buffer is constant, and
    wherein the size of the elastic input buffer is a function of the expected number, Nseq, of sequential code blocks that would require M iterations, and
    wherein said size of the elastic input buffer is Nseq multiplied by the size of a code block multiplied by M/N, or Nseq*M/N*Block size.

10. The system of claim 9, wherein in operation the decoder can increase or decrease the number of iterations when needed or feasible.

11. The system of claim 10, wherein if the elastic input buffer is filled, the decoder operates at no more than N iterations per code block.

12. The system of claim 9, wherein the decoder implements one of a Low Density Parity Code, a Turbo code and a modification of one of them.

13. The system of claim 9, wherein the size of the elastic output buffer is a function of the expected number of sequential code blocks that can be processed with less than N iterations.

14. The system of claim 9, wherein the decoder can exit processing of a code block upon the detection of one of a defined set of termination indicators.

15. The system of claim 9, wherein the decoder can increase to a maximum number of iterations M.

16. The system of claim 15, where M is greater than or equal to 4N.

17. A non-transitory program storage device readable by a processing unit, tangibly embodying a program of instructions executable by the processing unit to implement a method of efficiently performing iterative decoding, said method comprising:
    setting a decoder to operate at a nominal iteration rate N;
    increasing or decreasing the number of iterations when needed or feasible; and
    storing a queue of code blocks in each of an elastic input buffer and an elastic output buffer,
    wherein the input rate of code blocks to the input buffer and the out put rate of code blocks from the output buffer is constant,
    wherein the size of the elastic input buffer is a function of the expected number, Nseq, of sequential code blocks that would require M iterations, and
    wherein the size of the elastic input buffer is Nseq multiplied by the size of a code block multiplied by M/N, or Nseq*M/N*Block_size.

18. The non-transitory programmable storage device of claim 17, wherein in said method the decoder can increase to a maximum number of iterations M.

19. The non-transitory programmable storage device of claim 17, wherein in said method M is an integer multiple of N.

20. The non-transitory programmable storage device of claim 17, wherein in said method the decoder implements one of a Low Density Parity Code, a Turbo code and a modification of either of them.

21. The non-transitory programmable storage device of claim 17, wherein in said method the size of the elastic output buffer is a function of the expected number of sequential code blocks that can be processed with less than N iterations.

22. The non-transitory programmable storage device of claim 17, wherein in said method if the elastic input buffer is filled, the decoder operates at no more than N iterations per code block.

23. The non-transitory programmable storage device of claim 17, wherein in said method the decoder can exit processing of a code block upon the detection of one of a defined set of termination indicators.

24. The non-transitory programmable storage device of claim 17, wherein in said method the defined set of termination indicators include large portion of bits still in error after a defined number of iterations, static parity error count, and parity sum below a defined minimum threshold.

* * * * *